United States Patent [19]

Clark

[11] Patent Number: 4,807,080
[45] Date of Patent: Feb. 21, 1989

[54] INTEGRATED CIRCUIT ELECTROSTATIC DISCHARGE INPUT PROTECTION

[75] Inventor: Stephen E. Clark, San Jose, Calif.

[73] Assignee: Zilog, Inc., Campbell, Calif.

[21] Appl. No.: 62,211

[22] Filed: Jun. 15, 1987

[51] Int. Cl.⁴ .............................................. H02H 9/04
[52] U.S. Cl. ...................................... 361/56; 361/58; 361/91; 357/23.13
[58] Field of Search ...................... 361/56, 58, 91, 100, 361/110, 111; 357/23.13, 23.1, 51, 42

[56] References Cited

U.S. PATENT DOCUMENTS 4,541,002  9/1985  Shimada .................................. 357/51
4,605,980  8/1986  Hartranft et al. ...................... 361/56

FOREIGN PATENT DOCUMENTS

PCT/US86/-
   00697  4/1986  PCT Int'l Appl. .

OTHER PUBLICATIONS

Roundtree et al., "NMOS Protection Circuitry," *IEEE Transactions on Electron Devices*, vol. ED-32, No. 5, May 1985.

*Primary Examiner*—A. D. Pellinen
*Assistant Examiner*—Todd E. DeBoer
*Attorney, Agent, or Firm*—Majestic, Parsons, Siebert & Hsue

[57] ABSTRACT

Protection of the thin gate oxide of MOS field effect transistors from irreversible puncture due to undesired high voltages and currents generated by electrostatic discharge through handling or otherwise, is provided by a circuit structure at each input pad of an integrated circuit chip. One such feature includes the use of a barrier layer of polysilicon material to make an electrical contact between source and drain diffusions of a protective transistor and their respective aluminum conductors, in order to increase the amount of current that can be handled at such contacts without the aluminum conductor fusing though a diffusion into the substrate. Another such feature is to provide an initial, and perhaps only, protective transistor that has a very narrow channel between source and drain diffusions to allow a reversible breakdown to reduce the voltage across it to within, or nearly within, the maximum voltage that the protected thin gate oxide transistor can handle without being damaged. Further, current concentrations in the protective transistor are minimized by the use of elongated diffusions and associated solid elongated conductors having rounded corners.

10 Claims, 4 Drawing Sheets

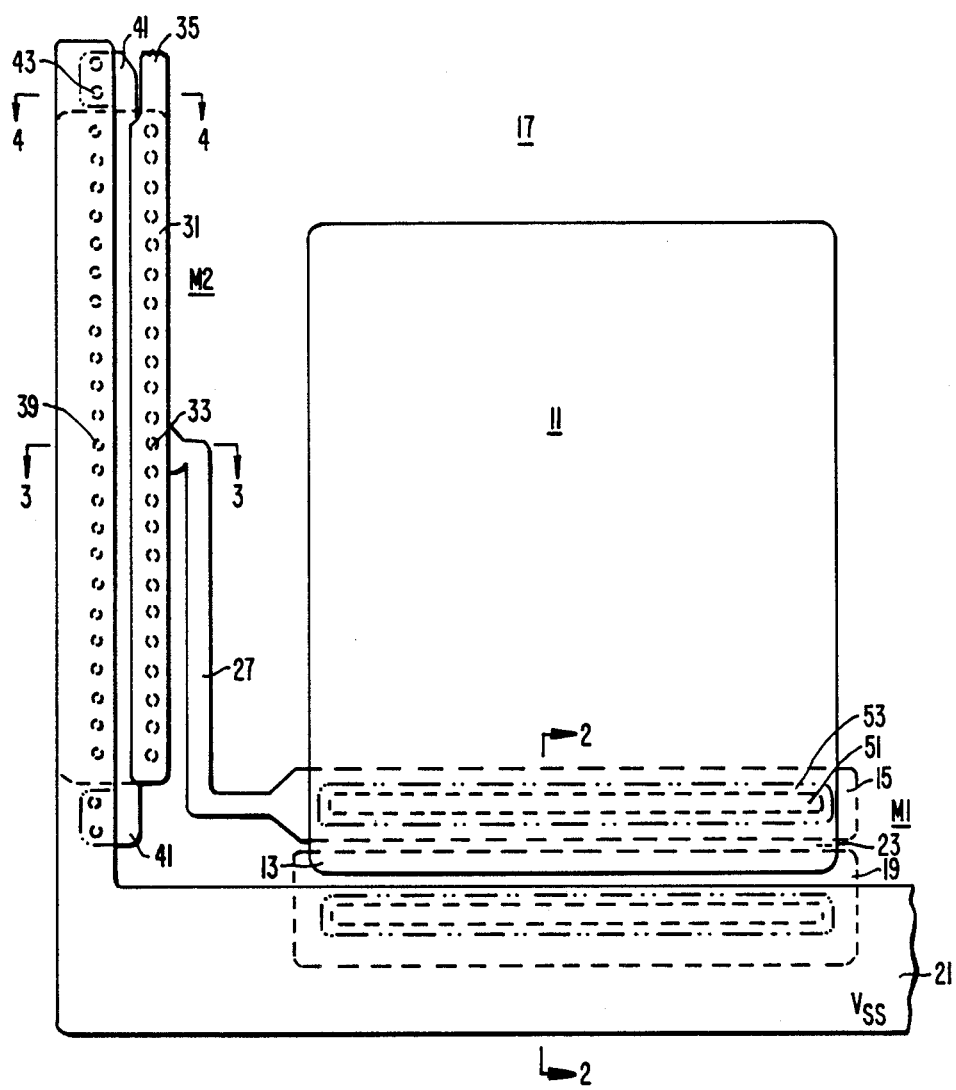
FIG._1.

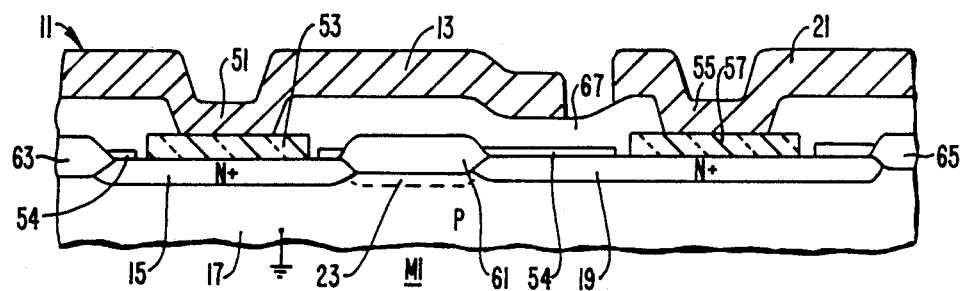
FIG._2.
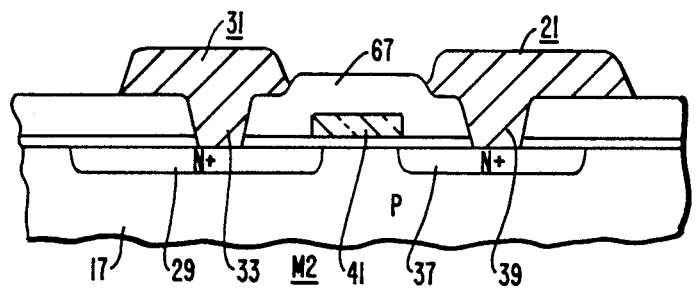
FIG._3.
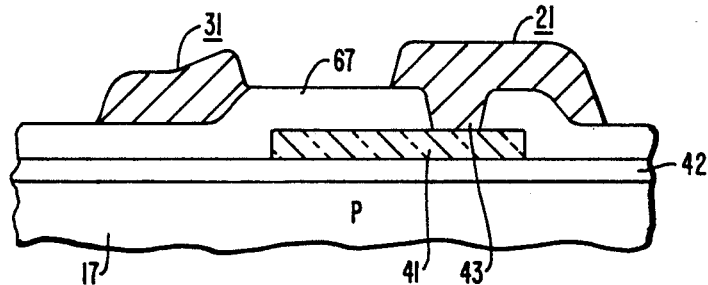
FIG._4.

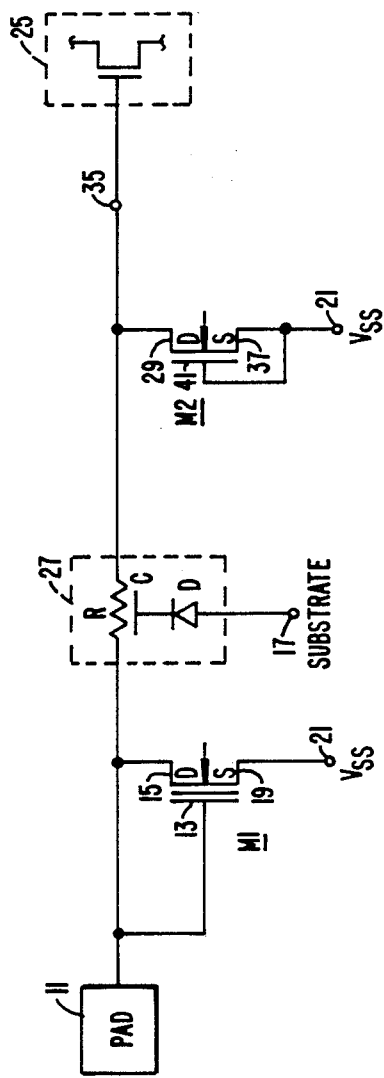
FIG._5.

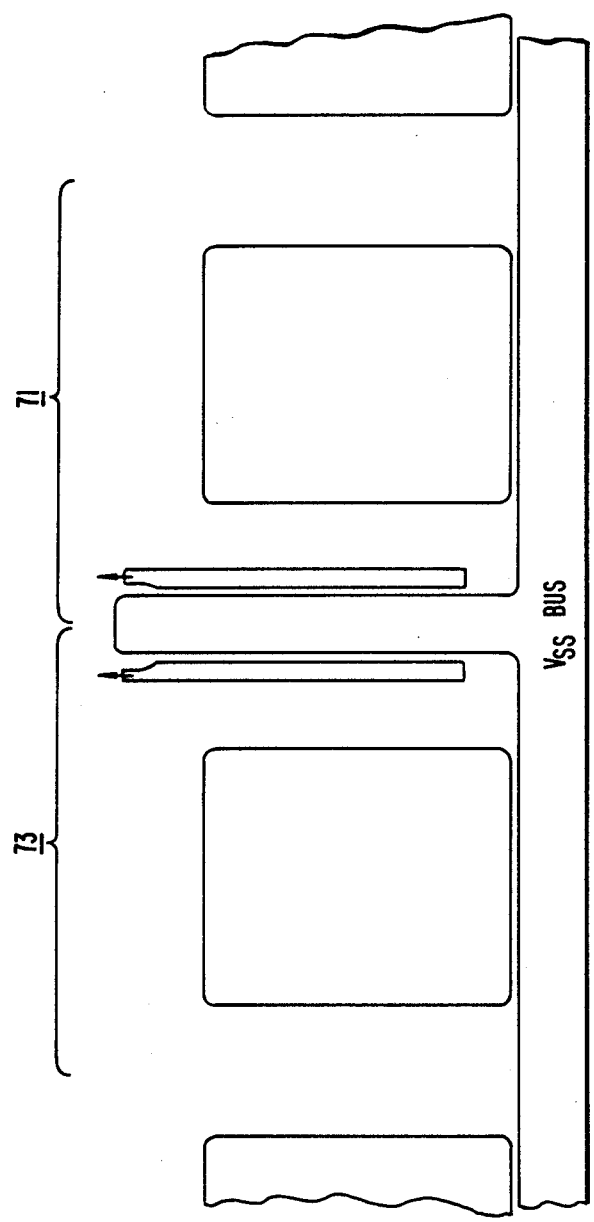
FIG._6.

INTEGRATED CIRCUIT ELECTROSTATIC DISCHARGE INPUT PROTECTION

BACKGROUND OF THE INVENTION

This invention relates generally to techniques and devices for protecting electronic circuits from high voltage spikes resulting from electrostatic discharges from handling of packaged integrated circuits.

From the beginning of metal-oxide-silicon (MOS) integrated circuit semiconductor technology, it has been recognized that electrostatic discharges through the circuit that result from human handling of a finished chip product can permanently affect the operation of the circuit in undesirable ways. Principally, a thin oxide layer that isolates a gate electrode from the substrate of a NMOS field effect transistor can be irreparably ruptured by a voltage spike being applied across it. In many cases, a gate electrode is connected in a signal path to a pin of a packaged integrated circuit, so the possibility of damage occurring during handling is very high, unless some protection circuitry is provided within the package.

The goal in providing such a protection circuit is to shunt the undesired voltage spikes around the sensitive field effect transistors without affecting the operation of the transistor. Early field effect transistors had a relatively thick gate oxide, so simple protection techniques were satisfactory. As the gate oxides have become thinner as part of an improvement in integrated circuit technology, the electrostatic voltage level that could harm the more delicate gate oxide have become significantly lower. As a result, protection circuits have become more complicated in order to assure that only a lower voltage reached the transistor being protected when the circuit was subjected to a high voltage electrostatic discharge spike.

Along with integrated circuit technology developments that decreased the gate oxide thickness, and thus made them more susceptible to damage from handling, the improving technology was allowing the size of integrated circuits to be shrunk in order to increase the number of circuits that can be produced at one time on a single wafer. The one circuit part that could not be shrunk was the bonding pad since a certain amount of area is required for bonding leads to the circuit chip. If a complicated electrostatic discharage circuit is provided with each input pad, limitations are presented in packing the pads together, and otherwise shrinking the circuit in order to take full advantage of improving process technology.

Accordingly, it is a primary object of the present invention to provide a circuit and integrated circuit layout for reducing any undesired electrostatic voltage spikes to a level that is not harmful to present thin gate oxide field effect transistors.

It is another object of the present invention to provide such a protection circuit and layout that takes very little area of an integrated circuit chip and does not limit the density of components that otherwise may be formed on the chip.

It is a further object of the present invention to provide such protection without adversely affecting the operation of the circuit which is being protected, particularly to maintain reliability and speed of operation of the circuit.

SUMMARY OF THE INVENTION

These and additional objects are accomplished by the various aspects of the present invention, wherein, briefly, several specific design features are cooperatively employed together in order to maximize its electrostatic voltage handling capability, yet minimize its complexity and amount of integrated circuit chip space that is necessary to form the circuit.

According to one aspect of the present invention, a first protective transistor is formed adjacent the input pad in a manner to prevent damaging high current densities from flowing when the protection circuit operates, and also to provide a protection against any aluminum of a circuit conductor that might melt during such a discharge. This protective transistor is formed, according to one embodiment, by a pair of elongated source and drain diffusions that are contacted by solid, elongated aluminum conductors through a layer of conductive polysilicon. The corners of the conductors and diffusions are rounded and otherwise arranged to assure that current density flowing in the transistor is substantially uniform when operating to shunt the high current produced by electrostatic voltage discharge, thereby to prevent high current concentration that can permanently the device. The layer of polysilicon disposed between the aluminum conductor in the source and drain diffusions provides a barrier to any melting aluminum from penetrating through the diffusion into the substrate, which will permanently damage the circuit if allowed to happen.

According to another aspect of the present invention, the width of the channel between the source and drain diffusions is made as small as possible. A width of from about three microns up to about six microns can provide an initial protective transistor that shunts enough current around the protective device by a reverse breakdown to limit the voltage seen by the protective device to less than 10 volts. This adequately protects transistor gates of a thickness in the range of 150 Angstroms to 250 Angstroms, dimensions which are at the leading edge of current semiconductor technology. This voltage limitation is accomplished with a single transistor, no second thin gate transistor, as is more conventionally additionally employed, being necessary. However, if the width of the channel of this first transistor cannot be made narrow enough, or it added backup protection is required, a second thin gate oxide transistor is provided to reduce the voltage further than the first transistor allows to pass towards the protective circuits.

In addition to the circuit protection functions, such a circuit makes a very efficient layout possible If only one protective transistor is necessary, of course, the space required for such a circuit is considerably reduced and allows packing the wire bonding pads closer together. If such a second transistor is necessary, a further arrangement according to the present invention allows for the use of common circuit elements for protective circuits of adjacent pads, in back-to-back arrangements.

Additional objects, advantages and features of the various aspects of the present invention will become apparent from the following description of its preferred embodiments, which description should be taken in conjunction with the accompanying drawings.

BRIEF DESCRIPTION OF THE DRAWINGS

FIG. 1 is a plan view of one wire bonding pad and associated protective circuitry according to a preferred embodiment of the present invention;

FIG. 2 is a cross-sectional view of the circuit structure of FIG. 1, taken through Section 2—2 thereof;

FIG. 3 is a cross-sectional view of the circuit structure of FIG. 1, taken through Section 3—3 thereof;

FIG. 4 is a cross-sectional view of the circuit structure of FIG. 1, taken through Section 4—4 thereof;

FIG. 5 is an equivalent schematic circuit of the protection circuit shown laid out in FIGS. 1-4; and FIG. 6 shows an arrangement of multiple units of a wire bonding pad and associated protective circuits.

DESCRIPTION OF THE PREFERRED EMBODIMENTS

The example protective circuit structure of FIGS. 1-5, which illustrates many of the various aspects of the present invention, is an NMOS type of circuit. However, the various aspects of the present invention are not limited to that type of circuit structure, but rather have applicability to other types, such as PMOS and various types of CMOS circuitry.

The protective circuit structure illustrated by FIGS. 1-5 has been found to operate satisfactorily when up to 5,000 volts is applied to an input pad, before the protective circuit itself fails. Within that range of up to 5,000 volts, the circuit being protected sees 10 volts or less. With this low voltage, the protected circuit can have a gate oxide thickness of from 150 Angstroms to 250 Angstroms without danger of being irreparably damaged by such a large electrostatic discharge voltage applied to the circuit.

Referring primarily to FIGS. 1 and 5, the overall structure of the embodiment of FIGS. 1-5 will be explained. A wire bonding pad 11 is generally of rectilinear shape with one edge 13 serving as a gate electrode of a first protective transistor M1, a thick film device. An elongated N+ diffusion 15 in a P doped silicon semiconductor substrate 17 is positioned under the pad 11 adjacent its edge 13. An elongated source N+ diffusion 19 a location extending beyond the edge 13 and under a voltage supply bus 21, in this case the $V_{ss}$. The elongated drain and source diffusions 15 and 19 form a channel 23 in the substrate 17.

The input signal desired to be communicated from the pad 11 to a protective circuit 25 is passed through a diffused resistor 27. An equivalent circuit of the diffused resistor 27 (FIG. 5) indicates, in addition to the series resistance, the formation of a capacitance coupling with the substrate 17 and a P—N junction in the form of a normally reverse biased diode. That signal is connected to a second protective transistor M2, this one being of a thin gate oxide type. The resistor diffusion 27 is extended into an elongated drain diffusion 29 of the transistor M2. The drain 29 is electrically connected to an elongated conductor 31 by a series of circular contacts, such as contact 33. An end 35 of the conductor 31 is extended (not shown) to connect with the operating circuit 25 that is being protected against the effects of electrostatic voltage discharge.

The second transistor M2 also includes an elongated source diffusion 37 that is connected to the $V_{ss}$ bus 21 by a series of circular contacts, such as the contact 39. An elongated polysilicon gate 41 is also connected to the $V_{ss}$ bus 21 by pins at each end of the gate, such as contact 43.

Details of the first transistor M1 will now be explained, primarily with respect to the plan view of FIG. 1 and a cross-sectional view of FIG. 2 that is taken at across 2—2 of FIG. 1. The electrical contact between the pad 11 and the drain diffusion 15 is made by an elongated depression 51 of the pad aluminum to form an elongated contact through a layer 67 of pyrox and an elongated layer of conductive polysilicon material 53. Similarly, connection between the $V_{ss}$ bus 21 and the source diffusion 19 is made through an elongated depression 55 of the aluminum conductor 21 to form an elongated contact through the pyrox layer 67 and an intermediate conductive polysilicon layer 57.

This diffusion contact structure of the protective transistor M1 has a beneficial effect of increasing the upper voltage limit that the protective circuit can handle without destruction. A common form of permanent damage to a protective circuit is a partial melting of an aluminum conductor, usually at a point where the conductor is attached to a diffusion, in response to the high currents that are generated by high electrostatic discharge voltages. The melted aluminum then migrates into the diffusion along the direction of current flow in the transistor. Once that aluminum migrates into the substrate of the device, the device is irreversibly damaged. Therefore, the use of the polysilicon layers 53 and 57 as a barrier between the aluminum conductors and the respective diffused region increases the temperatures and durations of high current that are required to cause such damage, thereby increasing the maximum electrostatic discharge voltage that the circuit can repetitively handle without damage.

The relative dimensions of the contact, polysilicon layer and diffusion also play a part in maximizing the voltage that can be handled. Because it is believed that the molten aluminum moves laterally as well vertically, the width of the polysilicon pads 53 and 57 is made to be wider than the width of their respective contacts 51 and 55. Similarly, the width of their respective diffusions 15 and 19 is made to be significantly wider than that of the polysilicon layers 53 and 57. A thin layer 54 of oxide has openings etched to provide openings slightly larger than the size of the self-aligned polysilicon layers 53 and 57.

Another goal of the specific layout of the transistor M1 that is illustrated in FIGS. 1 and 2 is to make the density of electrical currents flowing between the drain and source regions 15 and 19 to be as uniform as possible Care has been taken to avoid any "hot spots" from being generated and thus causing permanent damage to the circuit at relatively low currents and electrostatic voltages. Current density is made uniform by taking care that there are no sharp corners in the current paths, rounded corners being utilized with the conductors and polysilicon layers. The conductors and their respective polysilicon layers contact the diffusions continuously along most of their lengths, rather than using a circular or some other shaped non-continuous contact. The edges of the diffusions 15 and 19 adjacent the channel 23 are made to be as precisely parallel as possible. The longer the diffusions, the longer the channel between them across which current travels, and thus a lower current density is experienced. However, it has been found satisfactory to limit this length to be about the same as one edge of the pad 11. This allows a contact transistor that takes very little space. The dimensions of the pad 11 cannot be shrunk below that which is required for physical bonding of a wire to it, and making the diffusions about the same length of one edge of such pad has been found satisfactory for handling electrostatic voltages up to 5,000 volts and beyond.

Other parts of the transistor M1 shown in FIG. 2 are conventional. Field oxide 61 is grown over the channel 23 region. Regions 63 and 65 of field oxide are also grown on opposite sides of the drain and source diffusions. The layer of pyrox 67 is provided to insulate the conductive layers from other portions of the circuit structure. It will be noted that the thickness of the pyrox 67 and of the field oxide 61 keeps the gate portion 13 of the transistor spaced a significant distance from the channel 23.

For the NMOS circuit structure example being described, negative electrostatic voltages are shorted directly to the substrate 17, which is normally grounded, through a junction formed between the drain diffusion 15 and the substrate 17. That junction is a forward biased diode, under such circumstances. But with high positive voltages, that junction becomes a reverse biased diode and the transistor M1 is designed to pass current resulting from a high positive voltage across the channel 23 from the drain 15 to the source 19, and thence to the $V_{ss}$ bus 21. It has been found that as the width of the channel 23 is reduced, so is the resulting voltage that is allowed to pass through the diffused resistor 27 and onto the circuit being protected. A width of the channel 23 of 6 microns or less has resulted in such a voltage to be 10 volts or less, when an electrostatic voltage of thousands of volts is impressed on the circuit. A width of the channel 23 of 3-4 microns appears to provide very satisfactory protection for delicate transistors having gates as thin as in the range of from 150 Angstroms to 250 Angstroms.

In fact, it appears that if the width of the channel 23 is made that narrow, and the other structural features described above are implemented to maintain uniform current density in the transistor M1, the second transistor M2 can be dispensed with altogether. A second stage protective transistor is often used in protective circuits to reduce the voltage beyond that which the initial transistor can do by itself. However, with the particular structure of the transistor M1 described above, such second stage operation is not always necessary. The diffused resistor 27 remains desirable, however, in order to provide some time delay in an electrostatically induced voltage rise in order that the first transistor M1 will have an opportunity to respond to that voltage edge. However, the value of such a diffused resistor 27 need only be in a range of 100-1,000 ohms.

If the transistor M1 cannot be constructed to do the whole job itself, for some reason, or if an added measure of safety is desired in any event, the second transistor M2 is provided. This transistor is a thin gate device, as can be seen by the cross-sectional view of FIG. 3. Elongated drain 29 and source 37 are spaced apart to form a channel under an elongated, conductive polysilicon gate 41. The gate 41 is electrically tied to the $V_{ss}$ bus 21. A cross-sectional view of FIG. 4 of an end of the transistor M2 shows a wide end of the gate 41 in contact with the conductor 21 and separated from the substrate 21 by a field oxide layer 42.

The layout of the transistors M1 and M2 shown in FIG. 1 is designed to conserve space on integrated circuit chips and to allow a number of input paths and their associated protective circuitry to be grouped together in very little space. An example of a multiple pad structure is given in FIG. 6, wherein only the conductive metal elements of such circuits are shown. A first circuit 71 is that described with respect to FIGS. 1-5. A second circuit 73, having all the same characteristics, is laid out immediately adjacent the circuit 71 and is a mirror image thereof. The second transistor M2 of each of the input pads/circuits 71 and 73 now can share common elements, including a single $V_{ss}$ bus that is now made to be twice as wide as that used with a single circuit layout of FIG. 1. The source diffusions of each of the adjacent M2 transistors are also combined into a single diffusion that is twice as wide as that utilized in the FIG. 1 layout. On opposite sides of the pad/protective circuit 71 and 73 are similar pads and protective circuits which are again mere images of those against which they are positioned. The result is a very efficient use of space, allowing the pads themselves to be packed quite closely together. Of course, if the second transistor M2 is not utilized, then the pads can be packed even tighter together.

Although the various aspects of the present invention have been described with respect to preferred embodiments thereof, it will be understood that the invention is entitled to protection within the full scope of the appended claims.

It is claimed:

1. As part of an integrated circuit chip formed on a semiconductor substrate that includes a generally rectangularly shaped wire bonding pad and an active circuit to be protected from high electrostatic voltage spikes introduced through said pad, a protection circuit, comprising:

a first transistor formed on said semiconductor substrate, said first transistor having elongated source and drain regions formed in said substrate with a channel separation therebetween and positioned adjacent to an edge of only one side of said pad such that said pad edge extends over said channel with one of the source and drain regions being positioned under said pad and the other of the source and drain regions extending outside said pad, a first layer of electrically conductive polycrystalline silicon having one side thereof physically and electrically contacting said one of said source and drain regions along substantially its entire length, a second layer of electrically conductive polycrystalline silicon having one side thereof physically and electrically contacting said other of said source and drain regions along substantially its entire length, a first metal conductor attached to another side of the first polycrystalline silicon layer and extending directly upward to said pad, said first conductor extending continuously along substantially the entire length of the first layer and having corners that are rounded, a second metal conductor attached to another side of the second polycrystalline silicon layer and extending upward to a voltage supply bus conductor that is laterally separated from said one side of the pad, said second conductor extending continuously along substantially the entire length of the second layer and having corners that are rounded, and means connected to the source or drain region that is positioned under the pad for providing a signal path from said pad to said active circuit.

2. The protection circuit of claim 1 wherein the elongated source and drain regions are shaped and positioned to have opposing edges forming the channel separation therebetween that are substantially parallel to each other and separated by less than about 6 microns.

3. The protection circuit of claim 2 wherein said means for providing a signal path omits any further electrostatic voltage protective devices.

4. The protection circuit of claim 1 wherein said means for providing a signal path includes another transistor connected between said signal path and a voltage supply bus conductor.

5. The protection circuit of claim 1 wherein said means for providing a signal path consists of a diffused resistor.

6. The protective circuit of claim 5 wherein said diffused resistor has a value of less than about 1000 ohms.

7. The protection circuit of claim 1,
wherein said means for providing a signal path comprises a second transistor formed on said semiconductor substrate, said second transistor having elongated source and drain regions formed in said substrate with a channel separation therebetween, said source and drain regions having their length extending in a direction that is substantially perpendicular to that of the first transistor source and drain regions and being positioned adjacent to but separated from an edge of a side of said pad next to said one side, and
wherein said voltage supply bus has two legs that intersect each other substantially perpendicularly, one of said legs being positioned over the source or drain region of the first transistor to which said second metal conductor is attached, and the other of said legs being positioned over one of the source or drain regions of the second transistor and electrically connected thereto.

8. As part of an integrated circuit chip formed on a semiconductor substrate that includes a wire bonding pad and an active circuit to be protected from high electrostatic voltage spikes introduced through said pad, a protection circuit, comprising:
a transistor formed on said semiconductor substrate, said transistor having elongated source and drain regions formed in a said substrate with channel separation therebetween said channel separation being a substantially uniform distance along the length of said source and drain regions, said distance being less than about 6 microns,
a first layer of electrically conductive polycrystalline silicon having one side thereof physically and electrically contacting one of said source and drain regions along substantially its entire length,
a second layer of electrically conductive polycrystalline silicon having one side thereof physically and electrically contacting the other of said source and drain regions along substantially its entire length,
a first metal conductor attached to another side of the first layer and extending to said pad in electrical connection therewith, said first conductor extending continuously along substantially the entire length of the first layer and having corners that are rounded,
a second metal conductor attached to another side of the second layer and extending to a voltage supply bus conductor in electrical connection therewith, said second conductor extending continuously along substantially the entire length of the second layer and having corners that are rounded, and
means connected to the source or drain diffused region that is electrically connected to said pad for providing a signal path from said pad to said active circuit.

9. The protection circuit of claim 8 wherein said means for providing a signal path omits any further electrostatic voltage protective devices.

10. As part of an integrated circuit chip formed on a semiconductor substrate which includes (1) a wire bonding pad having at least first and second adjacent edges that are substantially straight and which extend in first and second respective directions that are substantially orthogonal to each other, and (2) an active circuit to be protected from high electrostatic voltage spikes introduced through said pad, a protection circuit positioned adjacent said wire bonding pad, comprising:
a first transistor having formed in said substrate source and drain region elongated in said first direction along said first pad edge and separated in said second direction by a channel region, said drain region being positioned under and electrically connected to said pad and said source region extending from under said pad along its said first edge,
a second transistor having formed in said substrate source and drain regions elongated in said second direction adjacent to but removed from said second pad edge and separated in said first direction by a channel region,
means including a resistor formed in said substrate for electrically connecting said first transistor drain to said second transistor drain,
a source voltage bus conductive layer having first and second segments extending substantially perpendicularly to each other and being positioned over said substrate but insulated therefrom,
said first bus segment being elongated in said first direction, being positioned over said first transistor source region, and being electrically connected with said first transistor source region,
said second bus segment being elongated in said second direction, being positioned over said second transistor source region, and being electrically connected with said second transistor source region, and
means for connecting said second transistor to said active circuit.

* * * * *